US010345375B2

(12) United States Patent
Dong et al.

(10) Patent No.: US 10,345,375 B2
(45) Date of Patent: *Jul. 9, 2019

(54) TEST METHOD AND TEST APPARATUS FOR TESTING A PLURALITY OF BLOCKS IN A CIRCUIT

(71) Applicant: International Business Machines Corporation, Armonk, NY (US)

(72) Inventors: Fei Dong, Shanghai (CN); Shu Gong, Shanghai (CN); Hai Long Li, Beijing (CN); Yin Peng Lv, Shanghai (CN); Liu Di Wang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 84 days.

This patent is subject to a terminal disclaimer.

(21) Appl. No.: 15/447,178

(22) Filed: Mar. 2, 2017

(65) Prior Publication Data

US 2017/0176528 A1    Jun. 22, 2017

Related U.S. Application Data

(63) Continuation of application No. 14/746,973, filed on Jun. 23, 2015, now Pat. No. 9,664,741.

(30) Foreign Application Priority Data

Oct. 28, 2014    (CN) .......................... 2014 1 0586635

(51) Int. Cl.
*G01R 31/317* (2006.01)
*G01R 31/3177* (2006.01)
(Continued)

(52) U.S. Cl.
CPC ... *G01R 31/31703* (2013.01); *G01R 31/3172* (2013.01); *G01R 31/3177* (2013.01);
(Continued)

(58) Field of Classification Search
CPC .......... G01R 31/31703; G01R 31/3177; G01R 31/31707; G01R 31/3172
See application file for complete search history.

(56) References Cited

U.S. PATENT DOCUMENTS 5,828,578 A    10/1998    Blomgren
6,785,841 B2    8/2004    Akrout et al.
(Continued)

FOREIGN PATENT DOCUMENTS

CN    101183140 A    5/2008
CN    104040499 A    9/2014

OTHER PUBLICATIONS

Pending CN Application No. 201410586635.4, Filed on Oct. 28, 2014, entitled: "Test Method and Test Apparatus for Testing a Plurality of Blocks in a Circuit", 26 pages.
(Continued)

*Primary Examiner* — Thien Nguyen
(74) *Attorney, Agent, or Firm* — L. Jeffrey Kelly

(57) ABSTRACT

A test apparatus and a test method for testing a plurality of blocks in a circuit, the plurality of blocks having identical structures. The test apparatus includes a comparing device, configured to collect output responses generated by the plurality of blocks by applying an excitation signal to the plurality of blocks in parallel, compare the output responses of the plurality of blocks to determine whether the output responses of the plurality of blocks are identical, and output results of the comparison of the comparing device; and a determining device, configured to receive the results of the comparison of the comparing device, and determine whether the plurality of blocks have a defect according to the results of the comparison of the comparing device.

17 Claims, 4 Drawing Sheets

(51) Int. Cl.
*G01R 31/3185* (2006.01)
*G01R 31/3193* (2006.01)

(52) U.S. Cl.
CPC ... *G01R 31/3193* (2013.01); *G01R 31/31707* (2013.01); *G01R 31/318563* (2013.01)

(56) References Cited

U.S. PATENT DOCUMENTS

| | | |
|---|---|---|
| 7,305,600 B2 | 12/2007 | Farnsworth, III et al. |
| 7,478,301 B2 | 1/2009 | Farnsworth, III et al. |
| 7,487,420 B2 | 2/2009 | Keller |
| 7,925,947 B1 | 4/2011 | Touba et al. |
| 7,979,764 B2 | 7/2011 | Foutz et al. |
| 8,418,007 B2 | 4/2013 | Mukherjee et al. |
| 8,433,961 B2 | 4/2013 | Hughes |
| 8,726,112 B2 | 5/2014 | Rajski et al. |
| 2005/0172189 A1 | 8/2005 | Ichikawa |
| 2006/0161824 A1* | 7/2006 | Brummel ............... G11C 29/26 714/718 |
| 2006/0200719 A1 | 9/2006 | Keller |
| 2009/0089636 A1* | 4/2009 | Fernsler ......... G01R 31/318533 714/728 |
| 2010/0023807 A1 | 1/2010 | Wu et al. |
| 2011/0119214 A1 | 5/2011 | Breitwisch et al. |
| 2011/0153533 A1 | 6/2011 | Jackson et al. |
| 2012/0109863 A1 | 5/2012 | Esser et al. |
| 2012/0109866 A1 | 5/2012 | Modha |
| 2012/0150781 A1 | 6/2012 | Arthur et al. |
| 2012/0191403 A1 | 7/2012 | Geukes et al. |
| 2012/0259804 A1 | 10/2012 | Brezzo et al. |
| 2013/0159799 A1* | 6/2013 | Brown ........... G01R 31/318566 714/726 |
| 2016/0116532 A1 | 4/2016 | Dong et al. |

OTHER PUBLICATIONS

Barnhart et al., "Extending OPMISR beyond 10x Scan Test Efficiency", IEEE Design & Test of Computers, Sep.-Oct. 2002, pp. 65-73.

Application No. 201410586635.4, Filed Oct. 28, 2014, Information Materials for IDS—References Cited by CN Examiner as Prior Art, 2 pages.

IBM, "IBM Unveils Cognitive Computing Chips", News room News releases, Aug. 18, 2011, https://www-03.ibm.com/press/us/en/pressrelease/35251.wss, 2 pages.

OBERLIN, "Machine Learning, Cognition, and Big Data", Copyright © 2012, 17 pages.

Preissl et al., "Compass: A scalable simulator for an architecture for Cognitive Computing", Published in: SC '12: Proceedings of the International Conference for High Performance Computing, Networking, Storage and Analysis, Date of Conference: Nov. 10-16, 2012, IEEE, 11 pages.

IBM: List of IBM Patents or Patent Applications Treated As Related (Appendix P), Mar. 2, 2017, 2 pages.

* cited by examiner

TEST METHOD AND TEST APPARATUS FOR TESTING A PLURALITY OF BLOCKS IN A CIRCUIT

BACKGROUND

The present disclosure relates to a field of design for testability of a circuit (e.g., a chip), and more specifically, to a test method and a test apparatus for testing a plurality of blocks in a circuit, the plurality of blocks having identical structures.

In order to improve circuit test efficiency, a hardware logic which may be used for testing a circuit is added into the circuit at a stage of designing the circuit, which is known as Design for Testability (DFT) of the circuit. Currently, a prevailing DFT method is a scan-based test method, which aims at identifying a manufacturing defect of a circuit (e.g., an undesirable short circuit or open circuit, etc.), rather than verifying a function of the circuit. In this method, when the circuit is designed, registers in the circuit are replaced with scan registers having scan input ports and scan output ports. When the circuit is tested, all the scan registers in the circuit may be connected into a scan chain. Then, excitation signals corresponding to one or more test patterns generated by an Automatic Test Pattern Generation (ATPG) tool are input to the scan chain, respectively. As known in the art, each test pattern can be used for testing, for example, one type of circuit defect, and includes an excitation signal to be applied to a circuit and an expected output response that should be generated in response to application of the excitation signal. Thus, by determining whether output responses of the scan chain are consistent with expected output responses corresponding to the respective test patterns, it can be determined whether the circuit has corresponding defects.

A plurality of blocks having identical structures (also referred to as reused blocks), such as intellectual property (IP) cores, neuron blocks in a cognitive computing circuit, etc., are often used in a designed circuit. As a scale of the circuit increases, a number of the blocks having the identical structures used in the circuit also increases. In existing DFT methods, these blocks are treated in the same way as other blocks, instead of adjusting the test methods for the circuit according to characteristics (i.e., "identical") of these blocks, therefore test efficiency is not high.

SUMMARY

Embodiments of the present disclosure provide a test apparatus and a test method for testing a plurality of blocks having identical structures in a circuit, which can simplify a test process for the plurality of blocks having the identical structures and improve test efficiency.

According to an aspect of the present disclosure, there is provided a test apparatus for testing a plurality of blocks in a circuit, the plurality of blocks having identical structures, the test apparatus comprising: a comparing device, configured to collect output responses generated by the plurality of blocks by applying an excitation signal to the plurality of blocks in parallel, compare the output responses of the plurality of blocks to determine whether the output responses of the plurality of blocks are identical, and output results of the comparison of the comparing device; and a determining device, configured to receive the results of the comparison, and determine whether the plurality of blocks have a defect according to the results of the comparison of the comparing device.

According to another aspect of the present disclosure, there is provided a test method for testing a plurality of blocks in a circuit, the plurality of blocks having identical structures, the test method comprising: collecting output responses generated by the plurality of blocks by applying an excitation signal to the plurality of blocks in parallel; comparing the output responses of the plurality of blocks to determine whether the output responses of the plurality of blocks are identical; and determining whether the plurality of blocks have a defect according to results of the comparison.

According to yet another aspect of the present disclosure, there is provided a test apparatus for testing a plurality of blocks in a circuit, the plurality of blocks having identical structures, and the test apparatus may execute the test method according to the above aspect of the present disclosure.

With the test apparatus and the test method according to the above aspects of the present disclosure, when a circuit includes a plurality of blocks having identical structures, an excitation signal can be applied to the respective blocks in parallel, and it can be determined whether these blocks have a defect according to output responses of the respective blocks. Thus, the plurality of blocks can be tested in parallel so that test efficiency may be improved. In addition, since the plurality of blocks can share one or more test patterns, the test apparatus and the test method described above can simplify a test process for the blocks.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
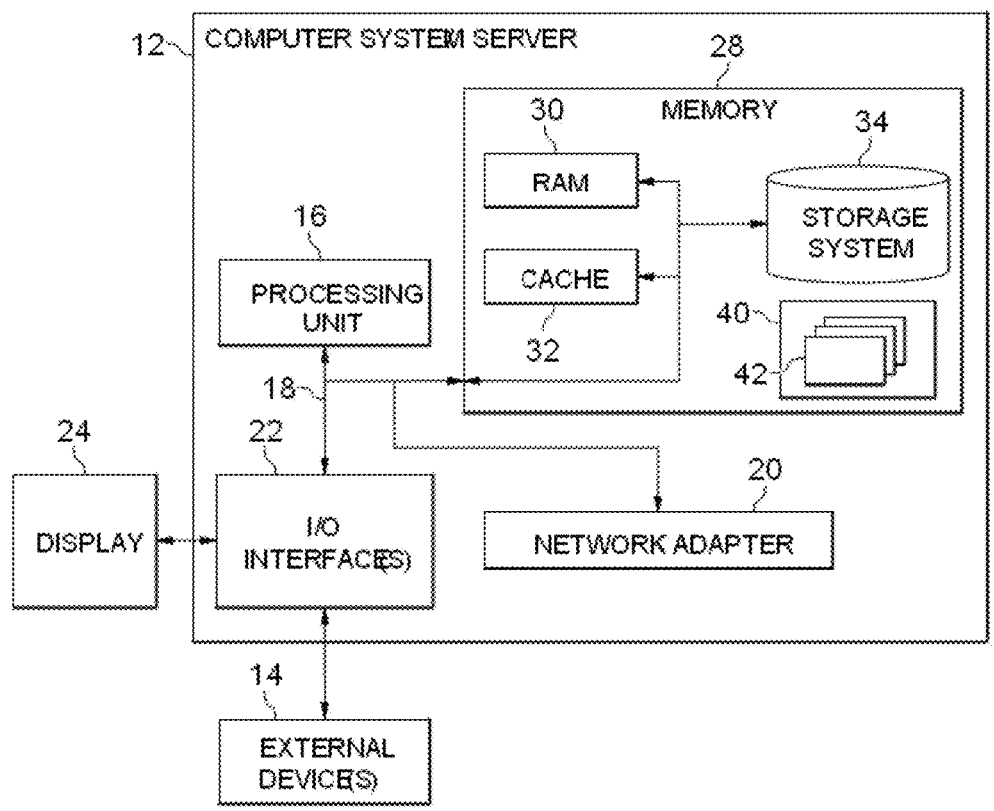
FIG. 1 shows an exemplary computer system/server 12 which is applicable to implement the embodiments of the present disclosure.

Referring now to FIG. 1, in which an exemplary computer system/server 12 which is applicable to implement the embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

With reference now to the accompanying drawings, a test apparatus and a test method for testing a plurality of blocks having identical structures in a circuit according to embodiments of the present disclosure will be described in detail. The circuit described herein may be a circuit in any form, such as an integrated circuit (or a chip) or a non-integrated circuit (or a discrete-component circuit). Hereinafter, the embodiments of the present disclosure will be described by using a chip as an example, and the description is also applicable to circuits in other forms.

Figure 2:
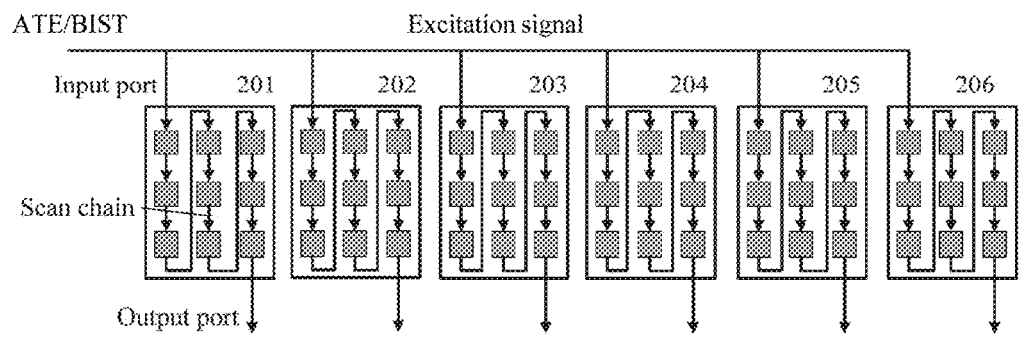
FIG. 2 shows a schematic diagram of connecting scan registers of each of six blocks having identical structures into one scan chain.

In the embodiment of the present disclosure, the plurality of blocks having the identical structures in the chip (which sometimes may be simply referred to as blocks hereinafter for convenience of description) have identical scan structures. As known in the art, a scan structure of a block refers to a number(s) and a construction(s) of a scan chain(s) included in the block, where a construction of a scan chain may include a scan register(s) connected in the scan chain and a connection order of the scan register(s). Specifically, as described above, when the chip is designed, the registers (including the registers in the respective blocks) in the chip may be replaced with scan registers having scan input (SI) ports and scan output (SO) ports, and accordingly, a SI port and a SO port may be provided on the chip, so as to receive scan/enable signals from outside and to output a test result to outside, etc. during the test. Each scan register can be switched between a scan mode and a normal mode (i.e., a register mode). Specifically, when the chip is used, the respective scan registers are kept in the normal mode, so that the respective scan registers execute a registering operation. When the chip is tested, the respective scan registers are switched to the scan mode to perform a scan test. In the embodiment of the present disclosure, the scan registers in each block may be connected into one or more scan chains, so that numbers of the scan chains in different blocks are the same, and constructions of the corresponding scan chains in different blocks are also the same, i.e., the respective blocks have a same scan structure. In other words, the respective blocks have the scan chains with identical structures. FIG. 2 shows a schematic diagram of connecting scan registers of each of six blocks having identical structures into one scan chain. In the example shown in FIG. 2, numbers (1) and constructions of the scan chains in blocks 201-206 are identical, so these blocks have the scan chains with identical structures or have identical scan structures. Additionally, as shown in FIG. 2, each scan chain has an input port and an output port. The input ports of the scan chains of the respective blocks may be connected together, so that an excitation signal may be input in parallel (i.e., broadcast) to the respective blocks via the input ports. It is to be recognized that, although FIG. 2 shows six blocks having the identical structures, this is only exemplary, and the number of the blocks may vary according to actual design requirements. Furthermore, although the scan registers in each block can be connected into one or more scan chains, the embodiments of the present disclosure will be described hereinafter by using one scan chain as an example for convenience of description.

To test the respective blocks, one or more test patterns can be generated in advance by using an ATPG tool based on netlists of the blocks. As described above, each test pattern includes an excitation signal to be applied to the blocks and an expected output response that should be generated by the blocks in response to application of the excitation signal. At the time of test, the excitation signal corresponding to each test pattern may be input to the respective blocks in parallel. Thereby, a logical structure test may be performed on the respective blocks, so that the respective blocks generate corresponding output responses. The output responses may be signals in various forms, for example, a bit sequence of one or more bits consisting of 0 and/or 1. In a case where the chip/block is tested by an Automatic Test Apparatus (ATE), the excitation signal may be applied by the ATE. In a case where a Built-in Self-test (BIST) circuit is provided in advance in the chip, the excitation signal can be applied by the BIST circuit. A method for generating the test pattern by the ATPG tool and applying the excitation signal to the blocks so as to perform the logical structure test on the respective blocks is known in the art, and a description thereof is omitted here.

In the embodiment of the present disclosure, for each test pattern, it may be determined whether these blocks have a defect corresponding to the test pattern according to whether the output responses of the plurality of blocks having the identical structures are the same. Specifically, because the respective blocks have the identical scan structures, and a possibility that two blocks having identical structures generate identical erroneous output responses because of having identical defects is quite low, if none of the plurality of blocks has the defect, then the output responses generated by the respective blocks in response to the identical excitation signal should be the same, whereas if one or more blocks have the defect, then the output responses of the one or more blocks will be different from those of the other blocks. The embodiments of the present disclosure are proposed based on this understanding.

Figure 3:
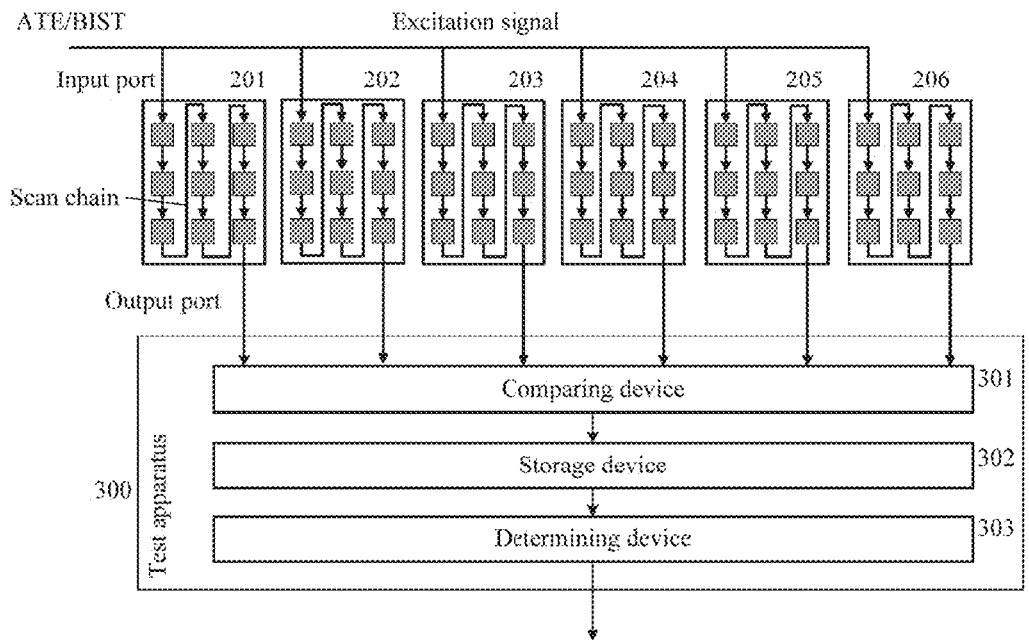
FIG. 3 shows a block diagram of a test apparatus for testing a plurality of blocks having identical structures in a circuit according to an embodiment of the present disclosure.

With reference now to FIG. 3, a test apparatus for testing a plurality of blocks having identical structures according to an embodiment of the present disclosure will be described in detail. In the embodiment, the test apparatus can be included in a chip, for example, be implemented as a circuit in the chip. In another embodiment, the test apparatus may be implemented as an apparatus or a circuit independent of the chip, which may be communicatively connected to the chip and the respective blocks. In a further embodiment, some components (e.g., a comparing device and a storage device described below) of the test apparatus may be placed inside the chip as a part of the chip, and other components of the test apparatus (e.g., a determining device described below) may be placed outside the chip.

As shown in FIG. 3, the test apparatus 300 may include a comparing device 301, a storage device 302 and a determining device 303. The test apparatus 300 is connected to the plurality of blocks having the identical structures (six blocks 201-206 having the identical structures in the example shown in FIG. 3).

The comparing device 301 may be connected to an output port of a scan chain of each block, so as to collect, for each test pattern, output responses generated by the plurality of blocks by applying an excitation signal to the plurality of blocks. Then, the comparing device 301 may compare the output responses of the respective blocks to determine whether their output responses are identical, and output comparison results of the comparing device.

In this embodiment, the comparing device 301 may compare the output responses of the plurality of blocks sequentially two by two, to determine whether the output responses of these blocks are identical. In the example shown in FIG. 3, the comparing device 301 may compare output responses of blocks 201 and 202, output responses of blocks 202 and 203, output responses of blocks 203 and 204, output responses of blocks 204 and 205, and output responses of blocks 205 and 206 sequentially, so as to determine respectively whether the output responses of the two blocks which are compared are identical. Specifically, the comparing device 301 may include a comparing unit provided in the chip for every two blocks to compare the output responses of the two blocks. In one implementation, the comparing unit may be implemented by using an XOR gate. In another implementation, the comparing unit may be implemented by using other types of integrated or non-integrated comparators or comparing circuits. In other embodiments, the comparing device 301 may compare sequentially output responses of three or more blocks respectively, to determine whether the output responses of these blocks are identical, so as to generate corresponding comparison results. In such a case, the comparing device 301 may include one or more comparing units provided for every three or more blocks. Of course, instead of providing a plurality of comparing units, only one comparing unit may be provided in the comparing device 301 and may be used to perform the comparing operation described above.

The storage device 302 is connected to the comparing device 301 to receive the comparison results generated by the comparing device 301 for all of the one or more test patterns and store the comparison results. Specifically, for each test pattern, in a case where the output responses of the plurality of blocks are compared sequentially two by two, the storage device 302 may store a comparison result generated by each comparison from the comparing device 301, so as to provide the comparison result to the determining device 303. For example, if the comparing device 301 outputs a bit 1 when determining that the output responses of two blocks which are compared are different, and outputs a bit 0 when determining that the output responses of the two blocks which are compared are identical, then the storage device 302 may store the bit 0 or 1 generated for every two blocks for indicating whether the output responses of the two blocks are identical. The storage device 302 may include a storage unit provided in association with each comparing unit (e.g., the XOR gate) and connected to the comparing unit. In one implementation, the storage unit may be implemented by an OR gate and a D flip-flop register. In another implementation, the storage unit may be implemented by another type of small-sized storage device.

After the comparison results generated by the comparing device 301 for all the test patterns are stored in the storage device 302, the comparison results may be provided from the storage device 302 to the determining device 303 for its use. In addition, the comparison results may be output from the storage device 302 serially to outside of the chip, for example, the ATE, via the SO port if necessary for its use. By serially outputting the comparison results generated for the plurality of blocks, the number of the SO port of the chip required to be used by the outputting operation can be reduced, so that the design of the chip may be simplified.

The determining device 303 may determine whether the plurality of blocks have a defect (e.g., defects corresponding to the respective test patterns) according to the comparison results. Specifically, for each test pattern, in a case where the output responses of the plurality of blocks are compared sequentially two by two, if the output responses of two blocks which are compared are identical, the determining device 303 may determine that the two blocks do not have the defect, otherwise may determine that at least one of the two blocks has the defect. In a case where it is determined that at least one of the two compared blocks has the defect, the determining device 303 may further identify the block(s) having the defect according to comparison results between the output responses of the two blocks and output responses of other blocks. Specifically, if the output response of one of the two blocks which are compared is identical to that of another block (i.e., some block in the plurality of blocks having the identical structures other than the two compared blocks), it can be determined that the other one of the two blocks has the defect. A method for the determining device 303 to identify the block having the defect will be described later in conjunction with specific examples.

Figure 4:
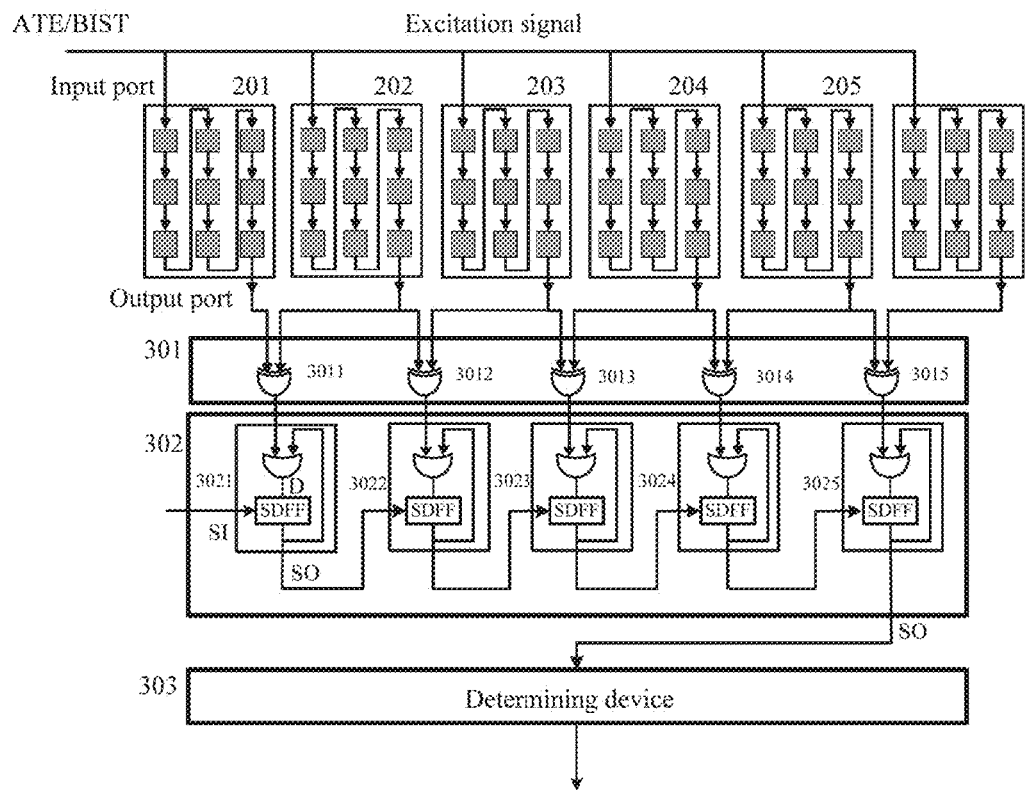
FIG. 4 shows an exemplary implementation of the test apparatus for testing a plurality of blocks having identical structures in a circuit according to the embodiment of the present disclosure.

With reference now to FIG. 4, an exemplary implementation of the test apparatus according to the embodiment of the present disclosure will be described. In this implementation, the test apparatus is implemented as a circuit.

As shown in FIG. 4, an XOR gate (a comparing unit) is provided for every two blocks among six blocks 201-206 having identical structures in the comparing device 301, so that the comparing device 301 includes five XOR gates 3011-3015. The XOR gate 3011 receives and compares output responses of the blocks 201 and 202, the XOR gate 3012 receives and compares output responses of the blocks 202 and 203, the XOR gate 3013 receives and compares output responses of the blocks 203 and 204, the XOR gate 3014 receives and compares output responses of the blocks 204 and 205, and the XOR gate 3015 receives and compares output responses of the blocks 205 and 206. If the output response of each block includes only 1 bit, and the output responses of two blocks compared by each XOR gate are different, then the XOR gate outputs 1, otherwise the XOR gate outputs 0. On the other hand, if the output response of each block includes N (N>1) bits, then each XOR gate can compare the output responses of the corresponding two blocks bit by bit, and output 1 for different bits and output 0 for identical bits, so as to output the comparison results for the N bits, and in this case, as long as there is a 1 in the N bits output by the XOR gate, it can be determined that the output responses of the two blocks which are compared are different.

In the storage device 302, a storage unit is provided in association with each comparing unit, so that the storage device 302 includes five storage units 3021-3025. Each storage unit stores a comparison result output from an associated XOR gate. Specifically, as shown in FIG. 4, each storage unit may include an OR gate and a D flip-flop register. The D flip-flop register can be a scan D flip-flop (SDFF) register which may be provided with a scan input (SI) port for inputting a scan signal, a data (D) port for inputting data to be registered, a scan output (SO) port for outputting data, a scan enable (SE) port for enabling the SDFF to enter a scan mode, and a clock (CLK) port for inputting a clock signal. For simplicity, only the D port, the SI port and the SO port are marked on the SDFF in the storage unit 3021 in FIG. 4 with the other ports being omitted. An input of the OR gate is connected to an output of the XOR gate, another input of the OR gate is connected to an output (the SO port) of the SDFF, and an output of the OR gate is connected to the D port of the SDFF, so as to form a feedback loop. In addition, as shown in FIG. 4, a SO port of a SDFF in each storage unit may be connected to a SI port of a SDFF in an adjacent storage unit, so that the SDFFs in the respective storage units form a scan chain, thus, by applying a driving signal to the SI port of the SDFF in the storage unit 3021, comparison results stored in the respective SDFFs can be serially output to the determining device 303, or to an external device (e.g., an ATE) via the SO port of the chip as described above.

Hereinafter, operations of the comparing device 301 and the storage device 302 will be described in conjunction with a specific example by using the comparing unit 3011 and the storage unit 3021 as examples. Since structures and operations of the comparing units 3011-3015 are similar to each other, and structures and operations of the storage units 3021-3025 are similar to each other, the description herein is also applicable to other comparing units and storage units.

In this example, it is assumed that an expected output response corresponding to a test pattern is a 4-digit bit sequence 0100, that is, when an excitation signal corresponding to the test pattern is applied to each block, a correct output response of the block is the bit sequence 0100, where each time when a clock edge arrives, one bit of the bit sequence is output from the block. If neither of the blocks 201 and 202 has a defect corresponding to the test pattern, then their output responses are identical (0100), therefore as clock edges arrive, the XOR gate 3011 outputs a bit sequence 0000 bit by bit, and the bit sequence is stored in the SDFF of the storage unit 3021. On the other hand, it is assumed that the block 201 does not have the defect and thus its output response is 0100, while the block 202 has the defect (for example, "stuck-at-1" defect) and thus its output response becomes 0110. In this case, when a first clock edge and a second clock edge arrive, since the first two bits (01) in the output responses of the two blocks are the same, the XOR gate 3011 outputs 00, so that 00 are stored in the SDFF. When a third clock edge arrives, since a third bit (0) of the output response of the block 201 is different from a third bit (1) of the output response of the block 202, the XOR gate 3011 outputs 1, so that 1 is stored in the SDFF. When a fourth clock edge arrives, since fourth bits of the output responses of the blocks 201 and 202 are both 0, the XOR gate 3011 outputs 0, and at this time, since 1 was stored in the SDFF when a previous clock edge arrived, 1 is stored in the SDFF. Thus, for this test pattern, 0011 are stored in the SDFF as a comparison result. In the manner described above, a bit sequence indicating a result of comparison between the output responses of the blocks 201 and 202 is stored in the SDFF for each test pattern.

With further reference to FIG. 4, the determining device 303 may determine whether the respective blocks have a defect based on the comparison results stored in the storage device 302 in the manner described above. The determining device 303 may be implemented as, for example, an on-chip or off-chip decoding device. Specifically, for a certain test pattern, if the output response of each block has only one bit, so that the comparison result generated by the comparing device also have only one bit, then the determining device 303 may determine whether the respective blocks have the defect corresponding to the test pattern according to the one bit. On the other hand, for a certain test pattern, if the output response of each block includes multiple bits, so that the comparison result generated by the comparing device also includes multiple bits, then the determining device 303 may check the comparison result bit by bit, and as long as the block having the defect corresponding to the test pattern is determined according to one bit therein, the determining device 303 may not check the other bits of the comparison result any more.

Figure 5:
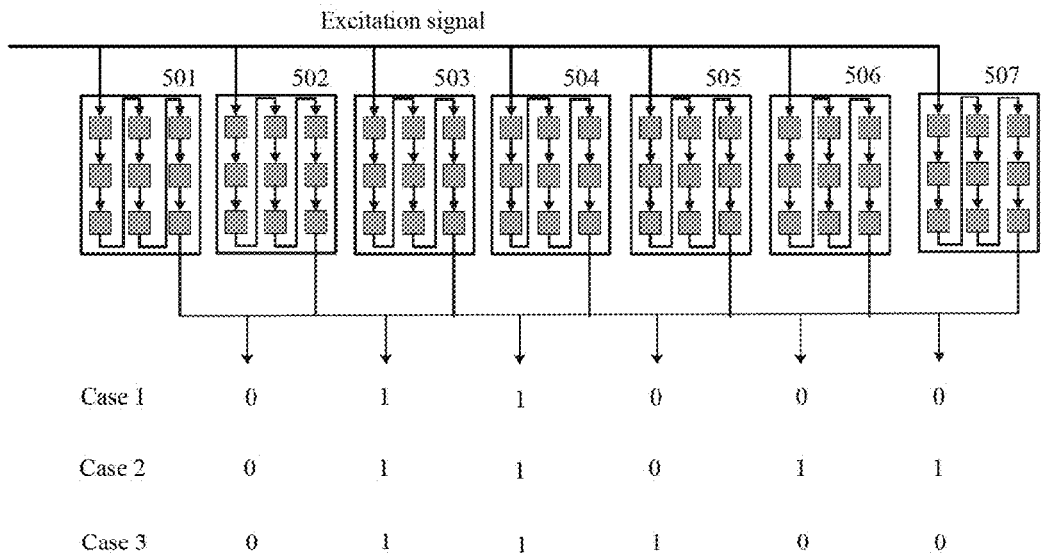
FIG. 5 shows an example of a method by which a determining device shown in FIG. 3 determines a block having a defect.

FIG. 5 shows an example of a method for the determining device 303 to determine the block having the defect in the exemplary case shown in FIG. 4. In FIG. 5, seven blocks 501-507 having identical structures are shown for convenience of explanation, and for the purpose of simplicity, the test apparatus shown in FIG. 3 is not shown, and only the respective blocks and the results of the comparison between their output responses two by two are shown. Further, it is assumed that for each test pattern, the comparison result generated by the comparing device includes only one bit (1 or 0).

In case 1 shown in FIG. 5, the results of the comparison between the output responses of the blocks 501-507 two by two are 0, 1, 1, 0, 0, 0 respectively for a certain test pattern. In this case, two consecutive 1 indicate that there is one block having the defect. Specifically, since the output responses of the blocks 502 and 503 are different, it can be determined that at least one of the blocks 502 and 503 has the defect. Likewise, since the output responses of the blocks 503 and 504 are different, it can be determined that at least one of the blocks 503 and 504 has the defect. Further, since the output responses of the blocks 502 and 501 are identical, and the possibility that the two blocks have identical defects and thus generate identical erroneous output responses is quite low, it can be determined that the blocks 501 and 502 do not have the defect, thereby it can be determined that the block 503 has the defect. Likewise, since the output responses of the blocks 504 and 505 are identical, it can be determined that the block 504 does not have the defect, thereby it can also be determined that the block 503 has the defect.

In case 2 shown in FIG. 5, the results of the comparison between the output responses of the blocks 501-507 two by two are 0, 1, 1, 0, 1, 1 respectively for a certain test pattern, i.e., there are two groups of two consecutive 1, which indicate that two of the blocks 501-507 have the defect. In this case, it can be determined that the blocks 503 and 506 have the defect in a manner similar to that for case 1.

In case 3 shown in FIG. 5, the results of the comparison between the output responses of the blocks 501-507 two by two are 0, 1, 1, 1, 0, 0 respectively for a certain test pattern, i.e., there are three successive 1. In this case, it can be determined that at least one of the blocks 502 and 503, at least one of the blocks 503 and 504, and at least one of the blocks 504 and 505 have the defect in the manner described above. Further, since the output responses of the blocks 502 and 501 are the same, it can be determined that the block 502 does not have the defect, thereby it can be determined that the block 503 has the defect. Likewise, it can be determined that the block 506 does not have the defect, and the block 505 has the defect. As for the block 504, its output response is different from the output responses of the blocks 503 and 505 having the defect, so it can not be determined that the block 504 has the defect. In this case, the block 504 may be considered as having the defect from a viewpoint of ensuring a normal operation of the circuit as far as possible.

With the above test apparatus according to the embodiment of the present disclosure, the plurality of blocks having the identical structures can be tested in parallel, so the test efficiency can be improved, and the more the blocks having the identical structures in the chip are, the higher the test efficiency is. Further, since the plurality of blocks can share one or more test patterns, the test process can be simplified. In addition, the test apparatus can be wholly or partially disposed on the chip, so that the test on the chip is more efficient. Moreover, since the test apparatus can be implemented by using a simple circuit, a cost and a size of the chip can be reduced.

It is to be recognized that the above embodiments are only illustrative rather than limitative. When necessary, those skilled in the art can make various changes to the above embodiments. For example, although it is mentioned in the above that the test apparatus includes the storage device 302, the storage device may be omitted, in which case the determining device 303 may directly receive the comparison results generated by the comparing device 301, and determine the block having the defect instantly in the manner described above, for example. Furthermore, the embodiment of the present disclosure is described above by taking connection of the scan registers in each block into one scan chain as an example, but this is not limitative, and the scan registers in each block may also be connected into a plurality of scan chains, and the respective blocks have identical scan structures, in which case output responses of corresponding scan chains (e.g., in a case where the scan chains in the respective blocks are numbered respectively in the same order, the scan chains having the same numbers in the respective blocks are the corresponding scan chains) in the respective blocks may be compared, and the blocks having the defect is determined in the above manner. Therefore, the test apparatus according to the embodiment of the present disclosure may have a flexible structure, and thereby may adopt different structures according to different chips.

Figure 6:
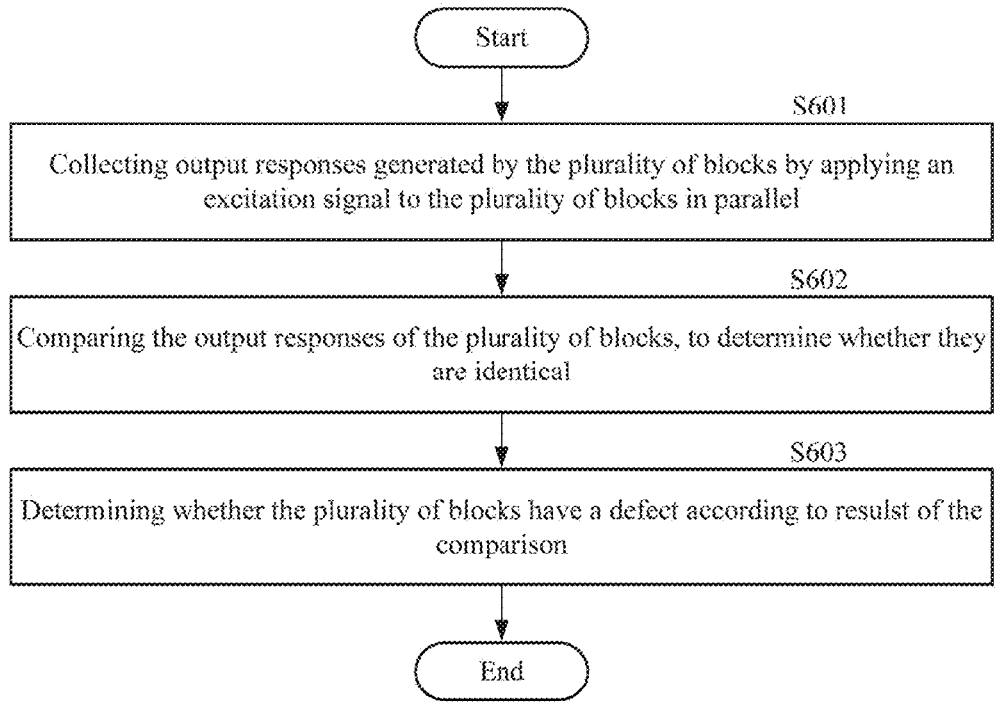
FIG. 6 shows a flow chart of a test method for testing a plurality of blocks having identical structures in a circuit according to an embodiment of the present disclosure.

With reference now to FIG. 6, a test method for testing a plurality of blocks in a circuit according to an embodiment of the present disclosure will be described below. Because the test method and the test apparatus described above are based on the same inventive concept, same or corresponding implementation details mentioned when the test apparatus is described are also applicable to the test method corresponding to the test apparatus described above, and since the test apparatus has been described in detail above, descriptions of the details may be omitted hereinafter. Here, the description is still made by taking a chip as an example of the circuit. In addition, as described above, the plurality of blocks have identical scan chains, each of which includes at least one scan register, and input ports of the scan chains of the respective blocks are connected together, so that an excitation signal corresponding to each test pattern can be applied to the scan chains of the plurality of blocks in parallel.

As shown in FIG. 6, in step S601, output responses generated by the plurality of blocks by applying a corresponding excitation signal to the plurality of blocks may be collected.

Then, in step S602, the output responses of the respective blocks may be compared, to determine whether the output responses of the respective blocks are identical. In this embodiment, the output responses of the plurality of blocks may be compared sequentially two by two, to determine whether the output responses of these blocks are identical. For example, the output responses of every two blocks may be compared by a comparing unit provided in the chip for the two blocks. In one implementation, the comparing unit may be implemented by using an XOR gate. In another implementation, the comparing unit may be implemented by using other type of integrated or non-integrated comparator or comparing circuit. In other embodiments, the output responses of three or more blocks may be respectively compared sequentially, to determine whether the output responses of these blocks are identical, so as to generate corresponding comparison results.

For each test pattern, after the output responses of the plurality of blocks are compared sequentially two by two and thereby the comparison results are generated, the comparison results may be stored. For example, the comparison results may be stored by a storage device. The storage device may include a storage unit provided in association with each comparing unit (e.g., the XOR gate) and connected to the comparing unit. In one implementation, the storage unit may be implemented by an OR gate and a D flip-flop register, where, as shown in FIG. 4, an input of the OR gate is connected to an output of the associated XOR gate, another input of the OR gate is connected to an output of the D flip-flop register, and an output of the OR gate is connected to an input of the D flip-flop register. In other implementations, the storage unit may be implemented by other type of small-sized storage device.

With further reference to FIG. 6, in step S603, it may be determined whether the plurality of blocks have a defect (e.g., defects corresponding to the respective test patterns) according to the comparison results. Specifically, for each test pattern, in a case where the output responses of the plurality of blocks are compared sequentially two by two, if the output responses of two blocks which are compared are identical, it may be determined that the two blocks do not have the defect; otherwise, it may be determined that at least one of the two blocks has the defect. In a case where it is determined that at least one of the two blocks which are compared has the defect, the block having the defect may be further identified according to results of comparisons between the output responses of the two blocks and the output responses of other blocks. Specifically, if the output response of one of the two blocks which are compared is identical to the output response of another block (i.e., some block in the plurality of blocks having the identical structures other than the two compared blocks), it can be determined that the other one of the two blocks has the defect.

Thus, with the test method according to the embodiment of the present disclosure described above, the plurality of blocks having the identical structures can be tested in parallel, which can significantly improve test efficiency in a case where the chip has many blocks having identical structures. Furthermore, since the plurality of blocks can share one or more test patterns, the test process can be simplified.

Various embodiments for implementing the test apparatus and the test method according to the embodiments of the present disclosure have been described above with reference to the accompanying drawings. Those skilled in the art may understand that these embodiments are only exemplary rather than limitative. For example, although the test apparatus is implemented as a circuit in the above, the test apparatus described above can actually be implemented by software, hardware, or a combination thereof. For example, the test apparatus according to the embodiment of the present disclosure may be implemented by the above-described exemplary computer system/server in combination with the software. In this case, even if the exemplary computer system/server is the same as a general-purpose processing apparatus in hardware configuration, the apparatus will exhibit characteristics different from the general-purpose processing apparatus due to the function of the software contained therein, thereby forming the test apparatus according to the embodiment of the present disclosure.

The apparatus of the present disclosure comprises a plurality of units or blocks which are configured to execute corresponding steps. Those skilled in the art may understand how to write a program to implement actions performed by the units or blocks by reading the present specification.

Figure 7:
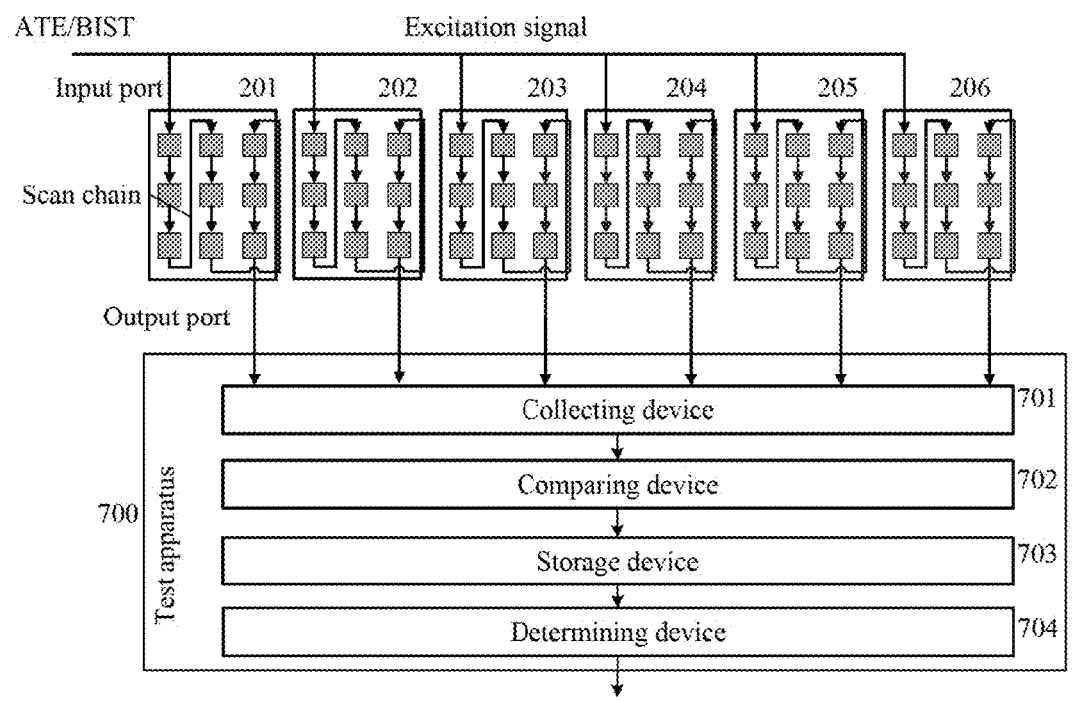
FIG. 7 shows a block diagram of a test apparatus for testing a plurality of blocks having identical structures in a circuit according to another embodiment of the present disclosure.

For example, FIG. 7 shows a test apparatus for testing a plurality of blocks having identical structures in a circuit according to another embodiment of the present disclosure. The test apparatus can perform the test method described above. As shown in FIG. 7, the test apparatus comprises a collecting device 701, a comparing device 702, a storage device 703 and a determining device 704. In some embodiments, the storage device 703 may be omitted. Operation details of these blocks are the same as those described above with respect to the test apparatus 300 and the test method according to the embodiments of the present disclosure, so the operations of the respective blocks are only described briefly below, and descriptions of the same details are omitted.

The collecting device 701 may collect output responses generated by the plurality of blocks by applying a corresponding excitation signal to the plurality of blocks.

The comparing device 702 may compare the output responses of the respective blocks, to determine whether the output responses of the respective blocks are identical. In this embodiment, the comparing device 702 may compare the output responses of the plurality of blocks sequentially two by two, to determine whether the output responses of these blocks are identical. For example, the comparing device 702 may compare the output responses of every two blocks by a comparing unit provided in the chip for the two blocks. In other embodiments, the comparing device 702 may sequentially compare the output responses of three or more blocks respectively, to determine whether the output responses of these blocks are identical, so as to generate corresponding comparison results.

The storage device 703 may store the comparison results of the comparing device 702. Specifically, for each test pattern, after the output responses of the plurality of blocks are compared sequentially two by two and thereby the comparison results are generated, the storage device 703 may store the comparison results. The storage device 703 may include a storage unit provided in association with each comparing unit and connected to the comparing unit.

The determining device 704 may determine whether the plurality of blocks have a defect (e.g., defects corresponding to the respective test patterns) according to the comparison results. Specifically, for each test pattern, in a case where the output responses of the plurality of blocks are compared sequentially two by two, if the output responses of two blocks which are compared are identical, the determining device 704 may determine that the two blocks do not have the defect, otherwise the determining device 704 may determine that at least one of the two blocks has the defect. In a case where it is determined that at least one of the two compared blocks has the defect, the determining device 704 may further identify the block having the defect according to results of comparisons between the output responses of the two blocks and the output responses of other blocks. Specifically, if the output responses of one of the two compared blocks are identical to the output response of another block (i.e., some block in the plurality of blocks having the identical structures other than the two compared blocks), the determining device 704 may determine that the other one of the two blocks has the defect.

Thus, with the test apparatus according to the embodiment of the present disclosure described above, in a case where the chip has many blocks having identical structures, the test process can be simplified and the test efficiency can be improved.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A test apparatus for testing a plurality of blocks in a circuit, the plurality of blocks having identical structures, the test apparatus comprising:
    a comparing device, configured to collect output responses generated by the plurality of blocks by applying an excitation signal to the plurality of blocks in parallel, compare the output responses of the plurality of blocks to determine whether the output responses of the plurality of blocks are identical, and output results of the comparison of the comparing device,
    wherein the comparing device compares the output responses of the plurality of blocks sequentially two by two to determine whether the output responses of the plurality of blocks are identical; and
    a determining device, configured to receive the results of the comparison of the comparing device, and determine whether the plurality of blocks have a defect according to the results of the comparison of the comparing device.

2. The test apparatus of claim 1, wherein in response to the output responses of two blocks under comparison being identical, the determining device determines that neither of the two blocks under comparison have the defect.

3. The test apparatus of claim 1, wherein in response to the output responses of two blocks under comparison being different, the determining device determines that at least one of the two blocks under comparison has the defect.

4. The test apparatus of claim 1, wherein in response to the output responses of two blocks under comparison being different, and the output response of one of the two blocks under comparison being identical to an output response of another block in the plurality of blocks other than the two blocks under comparison, the determining device determines that the other one of the two blocks under comparison has the defect.

5. The test apparatus of claim 1, wherein the plurality of blocks include scan chains having identical structures, each scan chain including at least one scan register, and wherein the excitation signal is applied to the scan chains of the plurality of blocks in parallel.

6. The test apparatus of claim 1, wherein the comparing device includes an XOR gate provided in the circuit for every two blocks, for comparing the output responses of the two blocks.

7. The test apparatus of claim 6, further comprising:
    a storage device, configured to store the results of the comparison generated by comparing the output responses of the plurality of blocks sequentially two by two, so as to provide the results of the comparison to the determining device.

8. The test apparatus of claim 7, wherein the storage device includes an OR gate and a D flip-flop register provided in association with each XOR gate, an input of the OR gate being connected to an output of the associated XOR gate, another input of the OR gate being connected to an output of the D flip-flop register, an output of the OR gate being connected to an input of the D flip-flop register, and the output of the D flip-flop register being connected to an input of another D flip-flop register associated with another XOR gate.

9. The test apparatus of claim 1, wherein the test apparatus is included in the circuit.

10. A test method for testing a plurality of blocks in a circuit, the plurality of blocks having identical structures, the test method comprising:
    collecting output responses generated by the plurality of blocks by applying an excitation signal to the plurality of blocks in parallel;
    comparing the output responses of the plurality of blocks sequentially two by two, to determine whether the output responses of the plurality of blocks are identical.

11. The test method of claim 10, in response to the output responses of two blocks under comparison being identical, determining that neither of the two blocks under comparison have a defect.

12. The test method of claim 10, in response to the output responses of two blocks under comparison being different, determining that at least one of the two blocks under comparison has the defect.

13. The test method of claim 10, in response to the output responses of the two blocks under comparison being different, and the output response of one of the two blocks under comparison being identical to an output response of another block in the plurality of blocks other than the two blocks under comparison, determining that the other one of the two blocks under comparison has the defect.

14. The test method of claim 10, wherein the plurality of blocks include scan chains having identical structures, each scan chain including at least one scan register, and wherein the excitation signal is applied to the scan chains of the plurality of blocks in parallel.

15. The test method of claim 10, wherein an XOR gate provided for every two blocks is used for comparing the output responses of the two blocks.

16. The test method of claim 15, further comprising:
    storing the results of the comparison generated by comparing the output responses of the plurality of blocks sequentially two by two, for use in determining whether the plurality of blocks have the defect.

17. The test method of claim 16, wherein the results of the comparison are stored by a storage device including an OR gate and a D flip-flop register provided in association with each XOR gate, an input of the OR gate being connected to an output of the associated XOR gate, another input of the OR gate being connected to an output of the D flip-flop register, an output of the OR gate being connected to an input of the D flip-flop register, and the output of the D flip-flop register being connected to an input of another D flip-flop register associated with another XOR gate.

* * * * *